United States Patent
Shimomugi et al.

(10) Patent No.: US 9,621,025 B2
(45) Date of Patent: Apr. 11, 2017

(54) BACKFLOW PREVENTING DEVICE, POWER CONVERSION APPARATUS, MOTOR DRIVER, AND REFRIGERATING AND AIR-CONDITIONING APPARATUS

(71) Applicant: Mitsubishi Electric Corporation, Tokyo (JP)

(72) Inventors: Takuya Shimomugi, Tokyo (JP); Koichi Arisawa, Tokyo (JP); Takashi Yamakawa, Tokyo (JP); Keisuke Uemura, Tokyo (JP); Noriyuki Matsubara, Tokyo (JP); Shinsaku Kusube, Tokyo (JP); Kenta Yuasa, Tokyo (JP); Akihiro Tsumura, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/901,270

(22) PCT Filed: Jul. 2, 2013

(86) PCT No.: PCT/JP2013/068162
§ 371 (c)(1),
(2) Date: Dec. 28, 2015

(87) PCT Pub. No.: WO2015/001617
PCT Pub. Date: Jan. 8, 2015

(65) Prior Publication Data
US 2016/0204690 A1    Jul. 14, 2016

(51) Int. Cl.
*H02P 27/04* (2016.01)
*H02M 1/32* (2007.01)
(Continued)

(52) U.S. Cl.
CPC .............. *H02M 1/32* (2013.01); *H02M 3/156* (2013.01); *H02M 3/158* (2013.01); *H02P 27/06* (2013.01);
(Continued)

(58) Field of Classification Search
CPC .............. H02P 27/04; H02P 27/06; H02P 6/00
(Continued)

(56) References Cited

U.S. PATENT DOCUMENTS 8,952,667 B2 * 2/2015 Ohshita ............... H02M 3/1584
323/207

FOREIGN PATENT DOCUMENTS

JP    59-117459 A    7/1984
JP    2005-160284 A    6/2005
(Continued)

OTHER PUBLICATIONS

International Search Report of the International Searching Authority mailed Aug. 20, 2013 for the corresponding International application No. PCT/JP2013/068162 (and English translation).
(Continued)

*Primary Examiner* — Antony M Paul
(74) *Attorney, Agent, or Firm* — Posz Law Group, PLC

(57) ABSTRACT

A backflow preventing device includes a backflow preventing element that is connected between a power supply and a load and that prevents electric current from flowing backward from the load side toward the power supply side, a commutating device that performs a commutation operation for causing the electric current to flow to a commutation path connected in parallel with the backflow preventing element, and a controller that sets a time for performing the commutation operation and causes the commutating device to perform the commutation operation based on the set time. The backflow preventing device has a plurality of the
(Continued)

commutation paths and has, for example, elements with small current-carrying capacities disposed in the commutation paths to achieve cost reduction and to cope with, for example, failures, thereby allowing for enhanced reliability for reducing recovery electric current.

18 Claims, 18 Drawing Sheets

(51) Int. Cl.
    *H02M 3/158*     (2006.01)
    *H02M 3/156*     (2006.01)
    *H02P 27/06*     (2006.01)
    *H02M 1/00*     (2006.01)

(52) U.S. Cl.
    CPC .. *H02M 2001/0051* (2013.01); *Y02B 70/1491* (2013.01)

(58) Field of Classification Search
    USPC ........... 318/400.01, 722, 800, 801; 363/5, 7, 363/21.06, 21.14, 34, 37, 40, 52, 55, 61, 363/64, 67, 81, 84, 108, 109, 114, 124, 363/125, 126, 153, 171, 174, 175
    See application file for complete search history.

(56) References Cited

FOREIGN PATENT DOCUMENTS

| | | |
|---|---|---|
| JP | 2012-137258 A | 7/2012 |
| JP | 2012-231646 A | 11/2012 |
| WO | 2012/042579 A1 | 4/2012 |
| WO | 2012/104889 A1 | 8/2012 |
| WO | 2012/120600 A1 | 9/2012 |

OTHER PUBLICATIONS

Yagihara et al., "The Characteristic Evaluation of Recovery Assist Boost Chopper", The Institute of Electrical Engineers Study Group documentation, SPC, semiconductor power conversion Study Group 2013 (1), pp. 27-32, Jan. 25, 2013, Japan (with English abstract).

Office Action mailed Jan. 25, 2017 issued in the corresponding KR application No. 10-2015-7036927 (and English translation).

* cited by examiner

BACKFLOW PREVENTING DEVICE, POWER CONVERSION APPARATUS, MOTOR DRIVER, AND REFRIGERATING AND AIR-CONDITIONING APPARATUS

CROSS REFERENCE TO RELATED APPLICATION

This application is a U.S. national stage application of International Application No. PCT/JP2013/068162 filed on Jul. 2, 2013, the disclosure of which is incorporated herein by reference.

TECHNICAL FIELD

The present invention relates to, for example, backflow preventing devices included in, for example, power conversion apparatuses.

BACKGROUND ART

Application fields of various kinds of power converting apparatuses have been studied in accordance with practical application of, for example, variable-voltage variable-frequency inverters.

For example, with regard to power converting apparatuses, the applied technology of buck-boost converters has been actively developed in recent years. Furthermore, for example, wide band-gap semiconductors composed of, for example, silicon carbide have also been actively developed. With regard to such new elements, elements that have high voltage resistant characteristics but have a small current-carrying capacity (i.e., a low permissible effective electric-current value) are put to practical use mainly as rectifiers (for example, see Patent Literature 1).

CITATION LIST

Patent Literature

Patent Literature 1: Japanese Unexamined Patent Application Publication No. 2005-160284 (FIG. 1)

SUMMARY OF INVENTION

Technical Problem

There are still many problems for such practical application of new highly-efficient elements. In particular, it may take time for such elements to be widely used in apparatuses that convert electric power to be supplied to, for example, motors of compressors in air-conditioning apparatuses. An apparatus is also known that has a device (i.e., a circuit) that commutates a portion of electric current flowing toward a rectifier to a different path to reduce recovery electric current occurring in the rectifier. Because such an apparatus has the new device (i.e., the circuit) in addition to a device that changes the electric power, such as a boosting device, there is a possibility of an increase in costs.

The present invention provides, for example, a power conversion apparatus that can achieve cost reduction as much as possible.

Solution to Problem

A backflow preventing device according to the present invention includes a backflow preventing element connected between a power supply and a load and configured to prevent electric current from flowing backward from a side of the load toward a side of the power supply, a commutating device configured to perform a commutation operation for causing the electric current to flow to a commutation path serving as a different path connected in parallel with the backflow preventing element, and a controller configured to set a time for performing the commutation operation and to cause the commutating device to perform the commutation operation based on the set time. The backflow preventing device has a plurality of the commutation paths.

Advantageous Effects of Invention

In the backflow preventing device according to the present invention, since the plurality of commutation paths connected in parallel with the backflow preventing element are provided, the amount of electric current flowing through each commutation path can be reduced. Therefore, for example, elements with small current-carrying capacities can be disposed in the commutation paths, so that cost reduction can be achieved. Furthermore, for example, even in a case where an element in a certain commutation path fails, the commutating device can still proceed with the commutation operation using another commutation path, thereby allowing for enhanced reliability for reducing recovery electric current.

DESCRIPTION OF EMBODIMENTS

Figure 1:
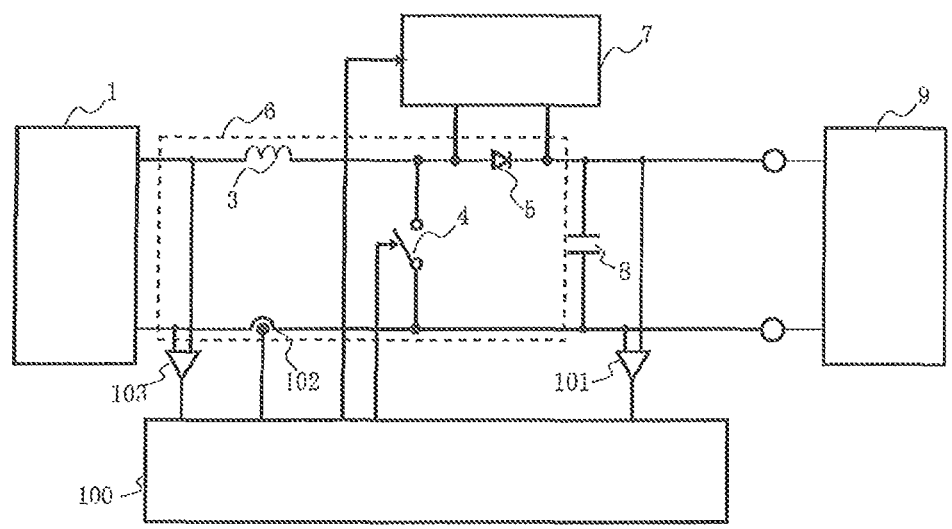
FIG. 1 illustrates an example of the configuration of, for example, a system having, as a principal component thereof, a power conversion apparatus according to Embodiment 1 of the present invention.

For example, a backflow preventing device according to each of Embodiment 1 to Embodiment 5 of the present invention will be described below with reference to the drawings. In the following drawings including FIG. 1, objects given the same reference signs are identical or equivalent objects and are common throughout the descriptions of Embodiment 1 to Embodiment 6 to be described below. The types of components described in the entire specification are exemplary and are not limited to the types described in the specification. In particular, combinations of components are not limited to the combinations specified in each of Embodiment 1 to Embodiment 6. Specifically, a component described in one Embodiment may be applied to another Embodiment. Furthermore, for example, with regard to the same type of devices that are differentiated from each other by suffixes, such devices may be described without the suffixes if it is not particularly necessary to differentiate them from each other or to specify them. Moreover, the dimensional relationships among components in the drawings may sometimes be different from those of actual ones.

Embodiment 1

FIG. 1 illustrates an example of the configuration of, for example, a system having, as a principal component thereof, a power conversion apparatus according to Embodiment 1 of the present invention. First, the system configuration in FIG. 1 having the power conversion apparatus that can perform electric power conversion with high efficiency will be described.

In the system in FIG. 1, the power conversion apparatus is provided between a power supply 1 and a load 9 and converts electric power from the power supply 1 and supplies it to the load 9. The power conversion apparatus according to Embodiment 1 is configured to boost voltage and has, for example, a chopper circuit 6, a commutating device 7, and a smoothing device 8.

The power supply 1 is constituted of, for example, a combination of a direct-current power supply, an alternating-current power supply, and a rectifying circuit (i.e., a rectifier), and supplies direct-current power to the chopper circuit 6.

The chopper circuit 6 has a reactor 3, a boosting switch device 4, and a backflow preventing element 5. The reactor 3 is connected to the power supply 1 and is provided for suppressing higher harmonic waves. The boosting switch device 4 has a switching element, such as an IGBT (insulated gate bipolar transistor). The boosting switch device 4 short-circuits the power supply 1 (i.e., between two terminals connected to the power supply 1) via the reactor 3 based on a drive signal (i.e., a boosting drive signal) from a controller 100.

The backflow preventing element 5 is an element provided between the boosting switch device 4 and the smoothing device 8 and configured to prevent backflow of electric current from the smoothing device 8. Normally, the backflow preventing element 5 is, for example, a semiconductor element, such as a fast recovery diode, which has excellent electrical characteristics (i.e., recovery characteristics in particular) and has a small current-carrying capacity and a short reverse recovery time. The commutating device 7 is a device connected in parallel with the backflow preventing element 5. The commutating device 7 performs a commutation operation for commutating electric current flowing toward the backflow preventing element 5 to a different path (i.e., another path not intervened by the backflow preventing element 5, which will be referred to as "commutation path" hereinafter) at a necessary timing. The backflow preventing element 5 and the commutating device 7 serve as a backflow preventing device that prevents electric current from flowing backward from the load 9 side toward the power supply 1 side.

Figure 2:
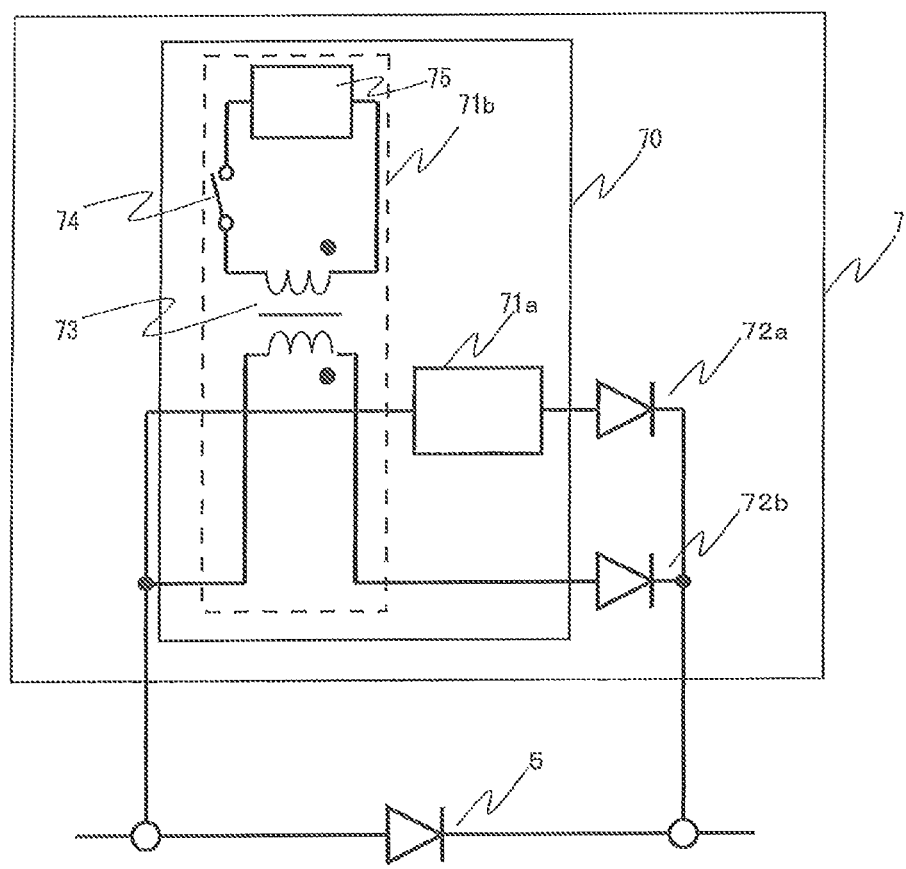
FIG. 2 illustrates an example (1) in which a commutating device 7 is connected in parallel with a backflow preventing element 5, in accordance with Embodiment 1 of the present invention.
Figure 3:
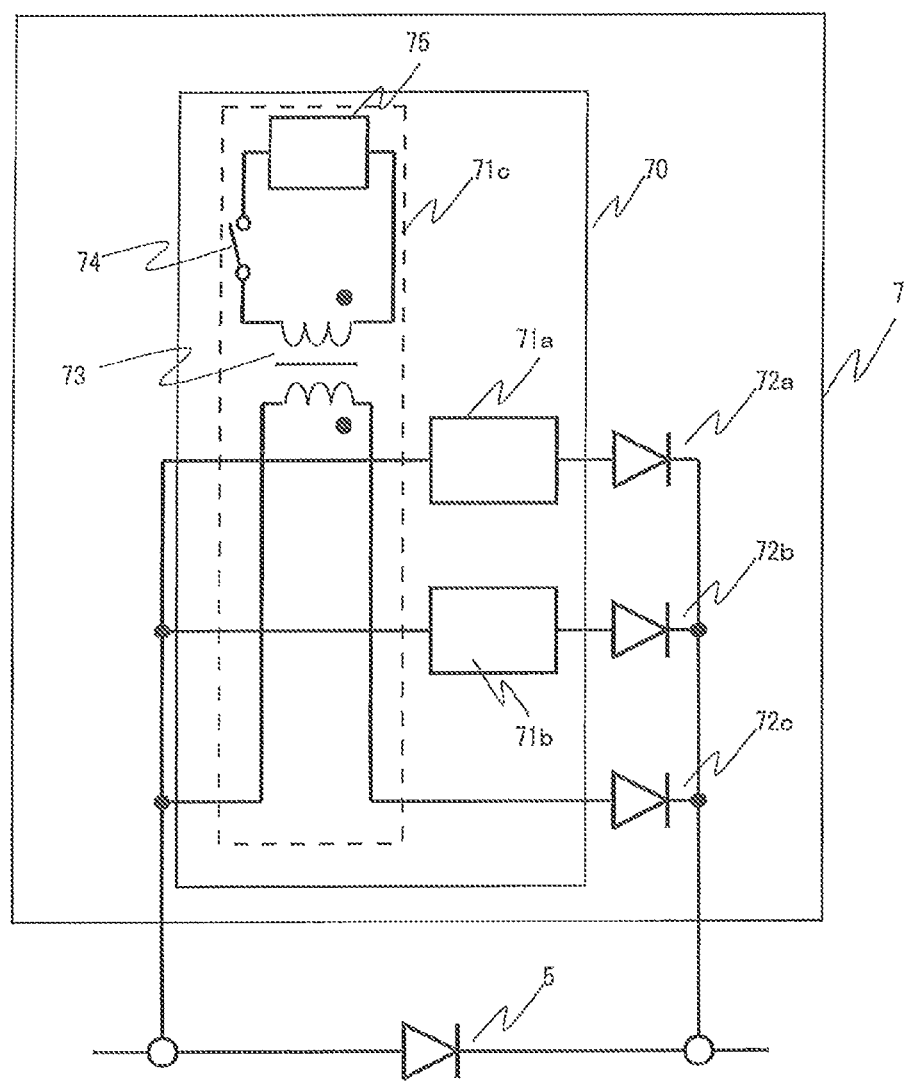
FIG. 3 illustrates an example (2) in which the commutating device 7 is connected in parallel with the backflow preventing element 5, in accordance with Embodiment 1 of the present invention.

FIG. 2 and FIG. 3 illustrate examples according to Embodiment 1 of the present invention, in which the commutating device 7 is connected in parallel with the backflow preventing element 5. The commutating device 7 is a device that performs a commutation operation for causing electric current to flow to a commutation path connected in parallel with the backflow preventing element 5. In FIG. 2, there are two commutation paths. In FIG. 3, there are three commutation paths. As shown in these drawings, the backflow preventing device according to Embodiment 1 has a plurality of commutation paths for commutation. As shown in FIG. 2 and FIG. 3, the commutating device 7 according to Embodiment 1 has a commutation operation unit 70 and commutation rectifying elements 72.

Each commutation rectifying element 72 is connected in series with a secondary winding of a transformer 73 in the corresponding commutation path. Each commutation rectifying element 72 prevents backflow of electric current from the load 9 side and causes the electric current to flow from the power supply 1 side toward the load 9 side. Since there are two commutation paths in FIG. 2, the commutating device 7 in FIG. 2 has commutation rectifying elements 72a and 72b. Since there are three commutation paths in FIG. 3, the commutating device 7 in FIG. 3 has commutation rectifying elements 72a, 72b, and 72c. The commutation rectifying elements 72 are constituted of semiconductor elements, such as fast recovery diodes. Alternatively, a Schottky barrier diode, which has good recovery characteristics, low forward voltage, a low loss, and high voltage resistant characteristics, may be used as each commutation rectifying element 72. As another alternative, wide-band gap semiconductor elements composed of, for example, SiC (silicon carbide), GaN (gallium nitride), or diamond may be used. The use of these elements leads to an increase in crystal defects and an increase in costs as a permissible effective electric-current value becomes higher in the specifications thereof. Since an element with a low permissible effective electric-current value can be used as each commutation rectifying element 72 in Embodiment 1, a highly-efficient, cost-effective power conversion apparatus can be achieved.

The commutation operation unit 70 according to Embodiment 1 has commutation operation circuits 71 that are independent from the commutation paths. Since there are two commutation paths in FIG. 2, the commutating device 7 in FIG. 2 has commutation operation circuits 71a and 71b. Since there are three commutation paths in FIG. 3, the commutating device 7 in FIG. 3 has commutation operation circuits 71a, 71b, and 71c. Each commutation operation circuit 71 has a transformer 73, a commutation switch 74, and a commutation power supply 75. Although FIG. 2 illustrates the configuration within the commutation operation circuit 71b and FIG. 3 illustrates the configuration within the commutation operation circuit 71c, the commutation operation circuit 71a also has a similar configuration. The transformer 73, which has, for example, a pulse transformer, applies voltage to a primary winding and causes excitation current to flow therethrough, thus inducing voltage to the secondary winding and causing electric current to flow therethrough. The transformer 73 also commutates electric current flowing through the chopper circuit 6 to the corresponding commutation path. The commutation power supply 75 supplies electric power to the transformer 73. The commutation switch 74 opens and closes based on a drive signal (i.e., a commutation drive signal) from the controller 100 and controls the electric power supply to the transformer 73 and the stoppage of the electric power supply to the transformer 73 (i.e., the primary winding).

With the intervention of the transformer 73 as described above, the commutation path and the circuit that connects the primary winding of the transformer 73, the commutation switch 74, and the commutation power supply 75 can be insulated from each other. Therefore, a signal for driving the commutating device 7 can be injected relatively easily. Moreover, a highly safe and reliable system can be established. Although FIG. 2 and FIG. 3 illustrate examples in which the secondary winding of each transformer 73 and the anode side of the corresponding commutation rectifying element 72 are connected to each other, the example is not limited to such connection if the direction of the electric current flowing through the commutation rectifying element 72 is the same. For example, the cathode side of each commutation rectifying element 72 and the secondary winding of the corresponding transformer 73 may be connected to each other. Furthermore, for example, a limiting resistor, a high-frequency capacitor, a snubber circuit, or a protection device may be inserted into each electric circuit constituted of the commutation power supply 75, the commutation switch 74, and the primary winding of the transformer 73, where necessary, in view of noise reduction and protection in the event of a failure. Furthermore, where necessary, a reset winding may be added to the primary winding of each transformer 73 so that excitation current can be reset. Moreover, by providing, for example, a rectifier, excitation energy may be regenerated at the power supply side so that increased efficiency can be achieved.

The smoothing device 8 is constituted of, for example, a capacitor, smooths voltage applied by the power supply 1, and performs electric power supply by applying direct-current voltage (i.e., output voltage, bus voltage) to the load 9. The load 9 is driven by the electric power supplied via the smoothing device 8.

A load voltage detector 101 is a voltage detector that detects the voltage smoothed by the smoothing device 8 and to be applied to the load 9 and outputs the detected voltage value in the form of a detection signal. An electric current detector 102 detects electric current (i.e., bus current) flowing from the power supply 1 and outputs the detected electric-current value in the form of a detection signal. Based on the detected electric-current value of the electric current detector 102, electric current flowing through the reactor 3 can also be detected. A power-supply voltage detector 103 is a voltage detector that detects voltage applied by the power supply 1 and outputs the detected voltage value in the form of a detection signal.

The controller 100 is a device that, for example, calculates the operation time (i.e., the short-circuit time) of the boosting switch device 4, the commutating device 7, or other devices from the detection-related signals from the load voltage detector 101, the electric current detector 102, and the power-supply voltage detector 103 and performs control. The controller 100 has, for example, arithmetic units, such as a microcomputer and a digital signal processor, and a converter that converts signals from the arithmetic units into drive signals for driving the boosting switch device 4 and the commutation switch 74. Since a plurality of commutation switches 74 are provided in Embodiment 1, a commutation drive signal corresponding to each commutation switch 74 is sent thereto.

The operation related to the system according to Embodiment 1 described above will be described below. The power conversion apparatus according to Embodiment 1 adds, for example, a commutation operation in the commutating device 7 to a power conversion operation of a DC chopper. Thus, the backflow preventing element 5 is reverse-recovered before electric current flows backward from the smoothing device 8, thereby reducing recovery electric current.

For example, when the operation is performed in a state where the boosting switch device 4 and the commutation switches 74 are turned off, the electric current path is established by the power supply 1, the reactor 3, the backflow preventing element 5, the load 9, and the power supply 1. When the operation is performed in a state where the boosting switch device 4 is turned on (i.e., closed) and the commutation switches 74 are turned off, the electric current path is established by the power supply 1, the reactor 3, the boosting switch device 4, and the power supply 1. In this case, the voltage applied to the reactor 3 is substantially equal to the voltage of the power supply 1. By repeating the on-off switching of the boosting switch device 4, the electric current paths can be alternated. Furthermore, by controlling the ratio of the on and off time periods, the waveform of input electric current by the power supply 1 can be arbitrarily changed, so that the power factor and the content percentage of higher harmonic current can be improved.

Normally, the number of accumulated carriers tends to increase as the current-carrying capacity of a rectifying diode increases. Therefore, the recovery electric current increases with increasing current-carrying capacity. Furthermore, the recovery electric current increases as the applied reverse bias voltage increases.

In the power conversion apparatus according to Embodiment 1, control (referred to as "commutation control" hereinafter) is performed by forming commutation paths with the commutating device 7 and performing reverse recovery by applying low reverse bias voltage via the transformers 73 and the commutation rectifying elements 72 immediately before the boosting switch device 4 is turned on, instead of performing reverse recovery by applying high reverse bias voltage to the backflow preventing element 5, which has a large current-carrying capacity.

In commutation control, the commutation switches 74 of the commutating device 7 are turned on immediately before the boosting switch device 4 is turned on, and the electric current flowing toward the backflow preventing element 5 is commutated toward the commutation rectifying elements 72 via the transformers 73. The electric current path in a state where the boosting switch device 4 is turned off and the commutation switches 74 are turned on is established by the power supply 1, the reactor 3, the backflow preventing element 5, the load 9, and the power supply 1. Furthermore, since the commutation switches 74 are turned on, the transformers 73 are excited, and the electric current also flows through the paths established by the secondary windings of the transformers 73 and the commutation rectifying elements 72 in the commutating device 7.

For example, commutation drive signals for the commutating device 7 (i.e., the commutation switches 74) are set to an on-state immediately before a boosting drive signal for the boosting switch device 4 is set to an on-state. In this case, the electric current starts to flow toward the paths of the secondary windings of the transformers 73 due to excitation current. Thus, the electric current flows distributively toward the backflow preventing element 5 and the commutation rectifying elements 72. Subsequently, as the commutation drive signals are maintained in the on-state, the electric current no longer flows toward the backflow preventing element 5 after a certain time period, so that the entire electric current flows toward the commutation rectifying elements 72 (i.e., the commutation is completed).

When performing the commutation operation, each commutation power supply 75 is set to a sufficiently low value, as compared with the output voltage of the smoothing device 8, so that the backflow preventing element 5 can be turned off (i.e., reverse-recovered) with low reverse bias voltage. When the boosting switch device 4 is turned on in this state, a reverse recovery operation of the commutation rectifying elements 72 is performed. In this case, recovery electric current is generated. However, since the electric-current flowing time in the commutation rectifying elements 72 is extremely short, as compared with that in the backflow preventing element 5, the effective electric current of the electric current flowing through the commutation rectifying elements 72 is low, meaning that the current-carrying capacities required therein may be small. Thus, small-capacity elements with a small number of accumulated carriers can be used, thereby allowing for reduction of recovery electric current, as compared with a case where recovery electric current is generated by the backflow preventing element 5 (in this case, the elements are selected in view of the peak electric current). As a result, a loss and an amount of noise resulting from recovery electric current can be reduced in the entire system. Consequently, the levels of noise terminal voltage, radiation noise, and so on are reduced, and a circuit loss is suppressed. Thus, a noise filter can be reduced in size, and cost reduction can be achieved.

Figure 4:
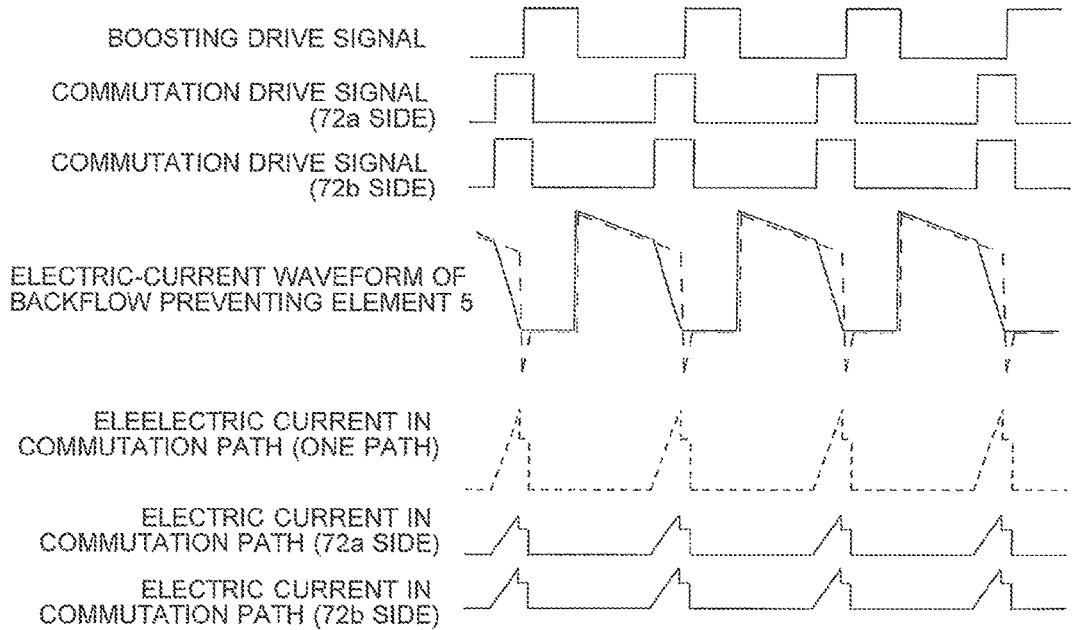
FIG. 4 is a diagram (1) illustrating signal and electric current waveforms in a case where the commutating device 7 according to Embodiment 1 of the present invention is operated.
Figure 5:
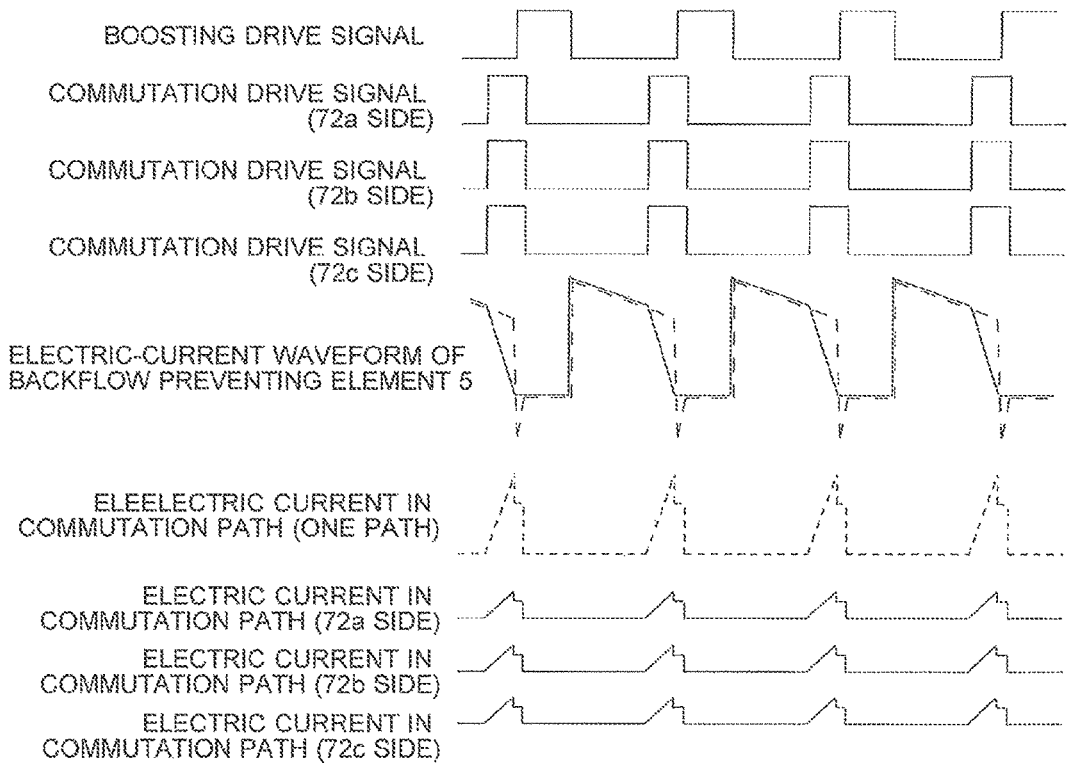
FIG. 5 is a diagram (2) illustrating signal and electric current waveforms in a case where the commutating device 7 according to Embodiment 1 of the present invention is operated.

FIG. 4 and FIG. 5 are diagrams illustrating signal and electric current waveforms in a case where the commutating device 7 according to Embodiment 1 of the present invention is operated. With regard to drive signals for the boosting switch device 4 and the commutating device 7 (i.e., the commutation switches 74), the HI side thereof is set as the active direction (i.e., on direction). As shown in FIG. 4 and FIG. 5, when the commutating device 7 is not caused to perform a commutation operation, large recovery electric current indicated by a dotted line occurs in the backflow preventing element 5. By causing the commutating device 7 to perform a commutation operation, the recovery electric current in the backflow preventing element 5 is reduced.

In Embodiment 1, the controller 100 sends commutation drive signals by which the commutation switches 74 are turned on and off at same timings as each other in the commutation operation circuits 71. Thus, the electric current flowing toward the commutating device 7 in accordance with the commutation operation is distributed to the commutation paths, so that a peak value and an average value of the electric current flowing to each commutation path decrease in accordance with the number of commutation paths, as compared with a case where a commutation rectifying element 72 is provided in a single commutation path. Furthermore, backflow of electric current from the load 9 side toward the power supply 1 side is also reduced. Therefore, the current-carrying capacity of each commutation rectifying element 72 can be reduced. By reducing the current-carrying capacity, many types of elements can be employed as the commutation rectifying elements 72. Moreover, cost reduction can be achieved. In addition, with the plurality of commutation paths provided, even if, for example, the electric current cannot flow toward a certain commutation path due to a failure of at least one of the commutation rectifying element 72 and the commutation operation circuit 71 in the commutation path, the electric current can still flow through another commutation path, thereby allowing for enhanced reliability.

Accordingly, since the system having the backflow preventing device according to Embodiment 1 has a plurality of commutation paths connected in parallel with the backflow preventing element 5, the electric current flowing through each commutation path can be reduced. Therefore, by making the commutation operation circuits 71 operate simultaneously, the electric current flowing through each commutation path can be reduced, so that, for example, an element with a small current-carrying capacity can be disposed in each commutation path, thereby achieving cost reduction. Furthermore, for example, even in a case where an element in a certain commutation path fails, the commutating device 7 can still proceed with the commutation operation using another commutation path, thereby allowing for enhanced reliability for reducing recovery electric current.

Embodiment 2

Figure 6:
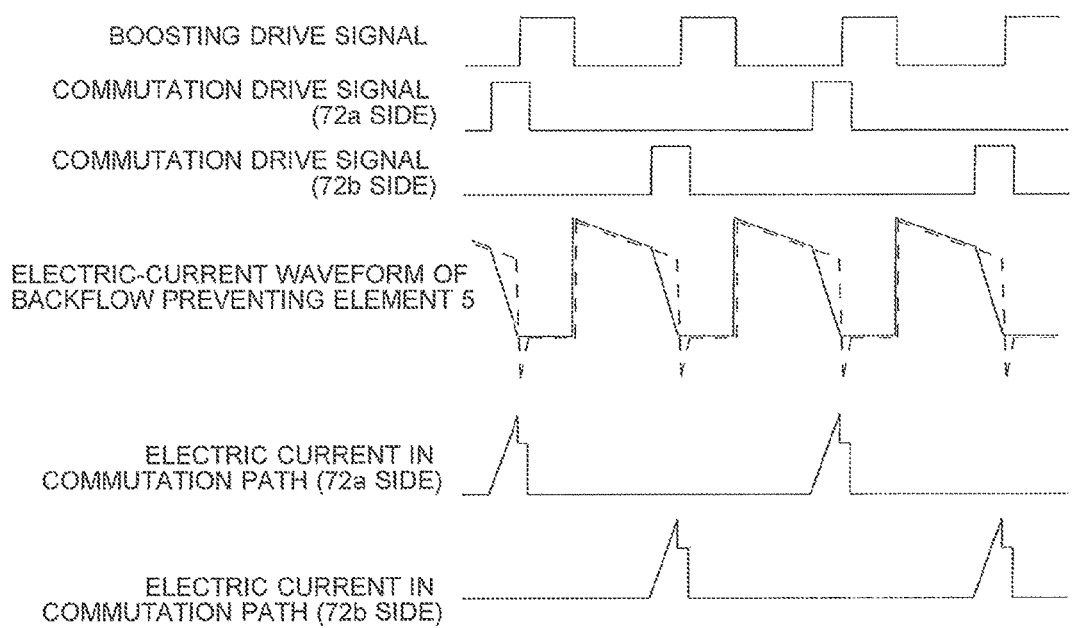
FIG. 6 is a diagram (1) illustrating signal and electric current waveforms in a case where a commutating device 7 according to Embodiment 2 of the present invention is operated.
Figure 7:
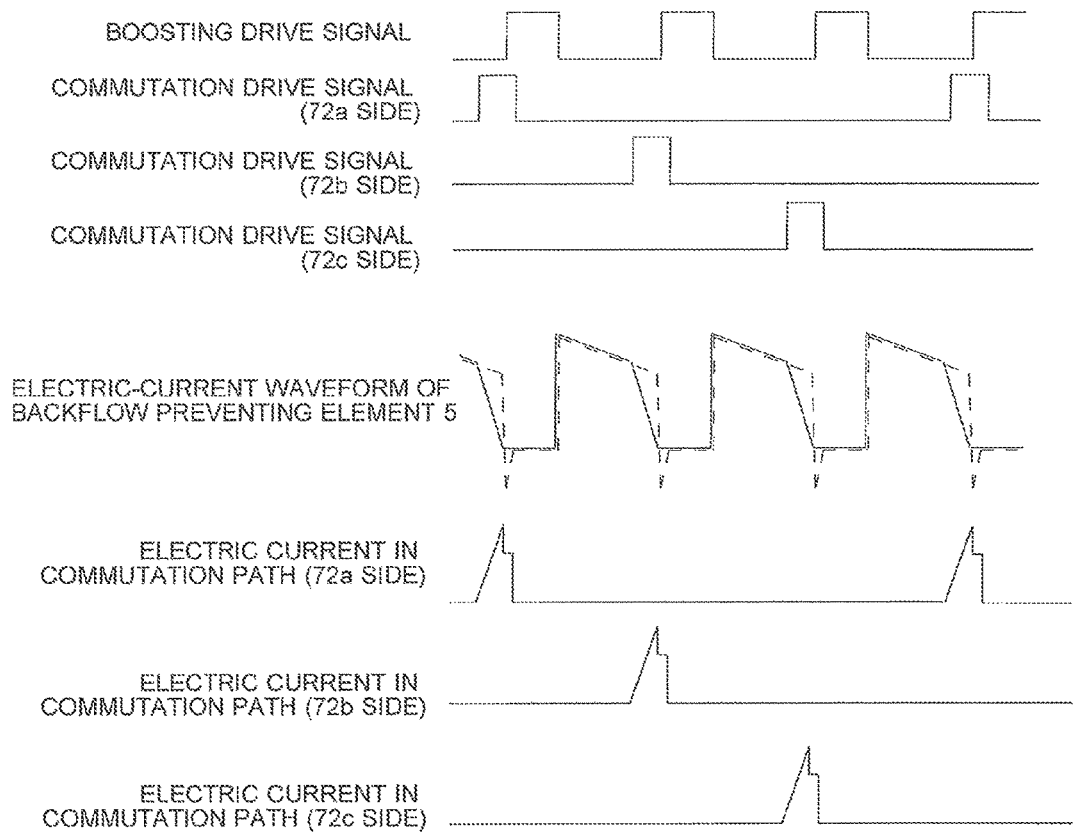
FIG. 7 is a diagram (2) illustrating signal and electric current waveforms in a case where the commutating device 7 according to Embodiment 2 of the present invention is operated.

FIG. 6 and FIG. 7 are diagrams illustrating signal and electric current waveforms in a case where a commutating device 7 according to Embodiment 2 of the present invention is operated. The configurations and so on of the system and the power conversion apparatus are similar to those described with reference to FIGS. 1 to 3 in Embodiment 1.

In Embodiment 2, the controller 100 sends commutation drive signals with different on-off timings to the commutation switches 74 in the commutation operation circuits 71. For example, in FIG. 6, the commutation drive signals are alternately set to an on-state relative to an on-state of a boosting drive signal. Thus, each commutation switch 74 is turned on once every time the boosting drive signal is set to an on-state twice. Therefore, the operation cycle is doubled, and the duty becomes ½.

In FIG. 7, the commutation drive signals are set to an on-state in correspondence with an on-state of the boosting drive signal. Therefore, each commutation switch 74 is turned on once every time the boosting drive signal is set to an on-state three times.

Accordingly, the commutation operation is performed in each commutation path instead of being performed simultaneously in the plurality of commutation paths. Because the interval (i.e., operation cycle) between the commutation operations in the commutation paths becomes longer by a factor of the number of parallel-connected lines, an effective electric-current value (i.e., an average) of the electric current flowing to each commutation path decreases in accordance with the number of commutation paths, as compared with a case where a commutation rectifying element 72 is provided in a single commutation path. Furthermore, electric-current concentration, such as unbalanced flow of electric current through the commutation paths, caused by, for example, variations in the elements does not occur.

Embodiment 3

Figure 8:
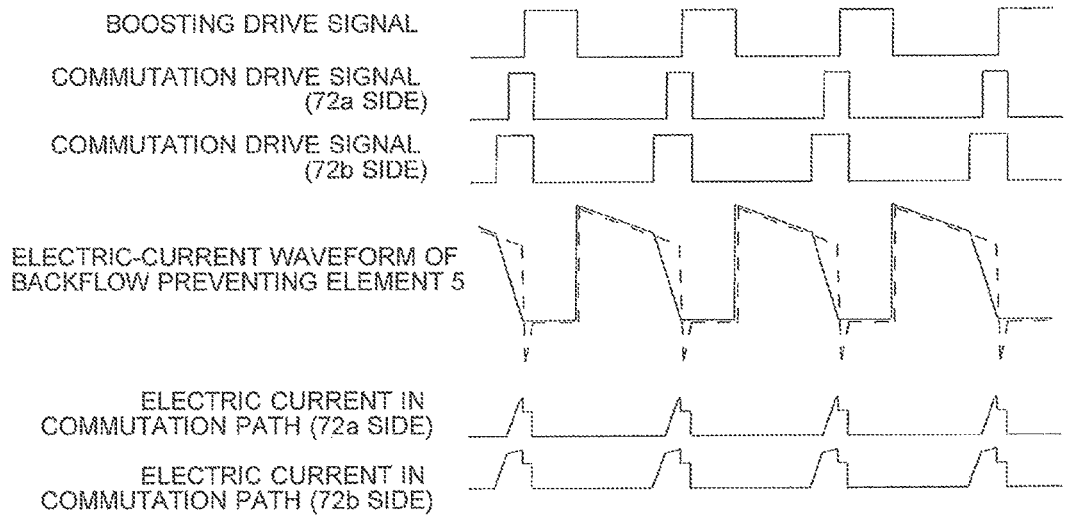
FIG. 8 is a diagram (1) illustrating signal and electric current waveforms in a case where a commutating device 7 according to Embodiment 3 of the present invention is operated.
Figure 9:
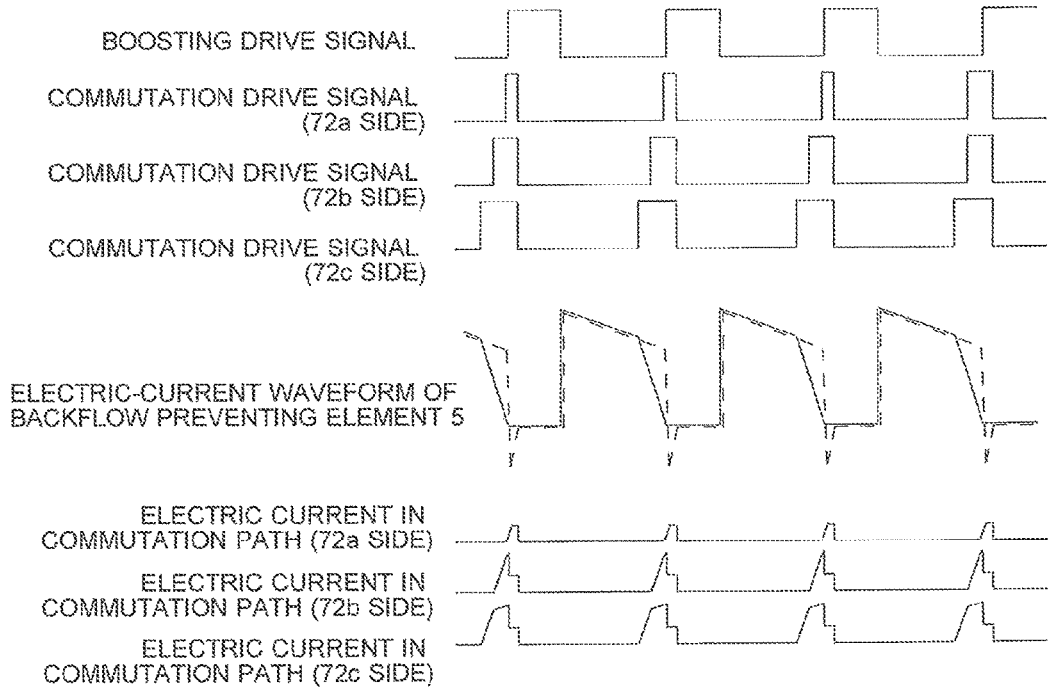
FIG. 9 is a diagram (2) illustrating signal and electric current waveforms in a case where the commutating device 7 according to Embodiment 3 of the present invention is operated.

FIG. 8 and FIG. 9 are diagrams illustrating signal and electric current waveforms in a case where a commutating device 7 according to Embodiment 3 of the present invention is operated. The configurations and so on of the system and the power conversion apparatus are similar to those described with reference to FIGS. 1 to 3 in Embodiment 1.

In Embodiment 3, the controller 100 sends commutation drive signals with different on-state time periods to the commutation switches 74 in the commutation operation circuits 71. In this case, the commutation drive signals are sent such that the on timings are substantially the same.

By setting different on-state time periods for the commutation switches 74 in the commutation operation circuits 71, the amount of flow of electric current varies from commutation path to commutation path. Therefore, the amount of electric current flowing through each commutation path can be adjusted in accordance with the commutation operation of the commutating device 7, thereby preventing the elements and so on in the commutation paths from being damaged. Moreover, by reducing the electric current flowing through the commutating device 7, a loss can be suppressed. According to circumstances, the number of commutation paths to which electric current flows may be reduced without turning on one or more of the commutation switches 74.

Figure 10:
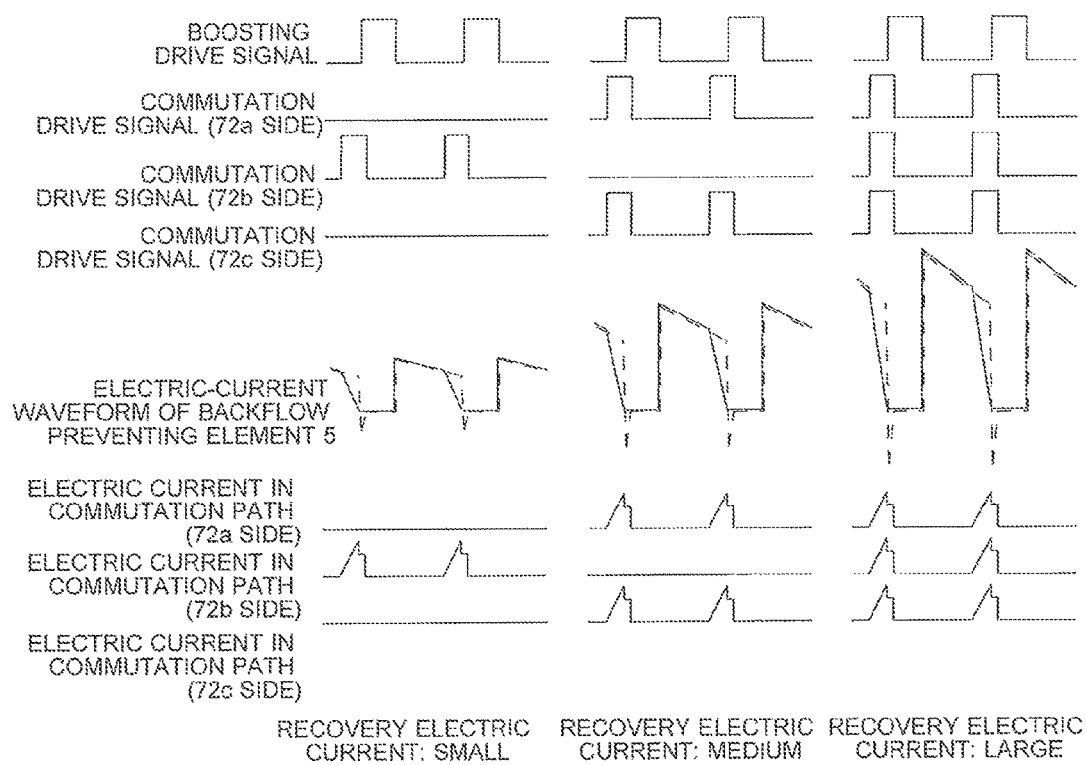
FIG. 10 is a diagram for explaining the relationship between a commutation operation and electric current flowing through the backflow preventing element 5 according to Embodiment 3 of the present invention.

FIG. 10 is a diagram for explaining the relationship between a commutation operation and electric current flowing through the backflow preventing element 5 according to Embodiment 3 of the present invention. FIG. 10 is directed to a case where the commutating device 7 has three commutation paths, as shown in FIG. 3. For example, the recovery electric current increases with increasing electric current flowing through the backflow preventing element 5. The controller 100 determines the magnitude of recovery electric current flowing from the load 9 side toward the power supply 1 side. FIG. 10 shows that the recovery electric current increases with increasing amount of electric current flowing through the backflow preventing element 5.

For example, the magnitude of recovery electric current can be determined from electric current flowing from the power supply 1 to the power conversion apparatus (i.e., electric current detected by the electric current detector 102), electric current flowing through the reactor 3, electric current flowing through the boosting switch device 4, electric current flowing through the backflow preventing element 5, or electric current flowing from the power conversion apparatus to the load 9. Therefore, by using an electric current detector to detect at least one of these electric current values, the controller 100 can determine the magnitude of recovery electric current. Furthermore, for example, the magnitude of recovery electric current can be determined from voltage applied to opposite terminals of the backflow preventing element 5 or from voltage applied to the load 9 (i.e., voltage detected by the load voltage detector 101). Therefore, a voltage detector may be used to detect at least one of these voltage values. Moreover, for example, the magnitude of recovery electric current can be determined from electric power supplied to the power conversion apparatus from the power supply 1 or from electric power supplied to the load 9 from the power conversion apparatus. Therefore, a power detector may be used to detect at least one of these electric power values. Since the detection can be achieved by any of the physical values, the detection can be shared with detection intended for another purpose.

Based on the determined magnitude of recovery electric current, the controller 100 sets the number of commutation paths to which electric current is made to flow in accordance with a commutation operation. Then, based on the set number of commutation paths, the controller 100 causes the corresponding commutation operation circuit or circuits 71 to perform a commutation operation by sending a commutation drive signal or signals thereto. Consequently, the amount of electric current flowing through each commutation path can be reduced. For example, in a case where the recovery electric current is large, advantages similar to those in, for example, Embodiment 1 are exhibited. In a case where the recovery electric current is small, a loss caused by the commutation operation is suppressed, so that reduction of loss in the entire apparatus can be achieved.

Embodiment 4

Figure 11:
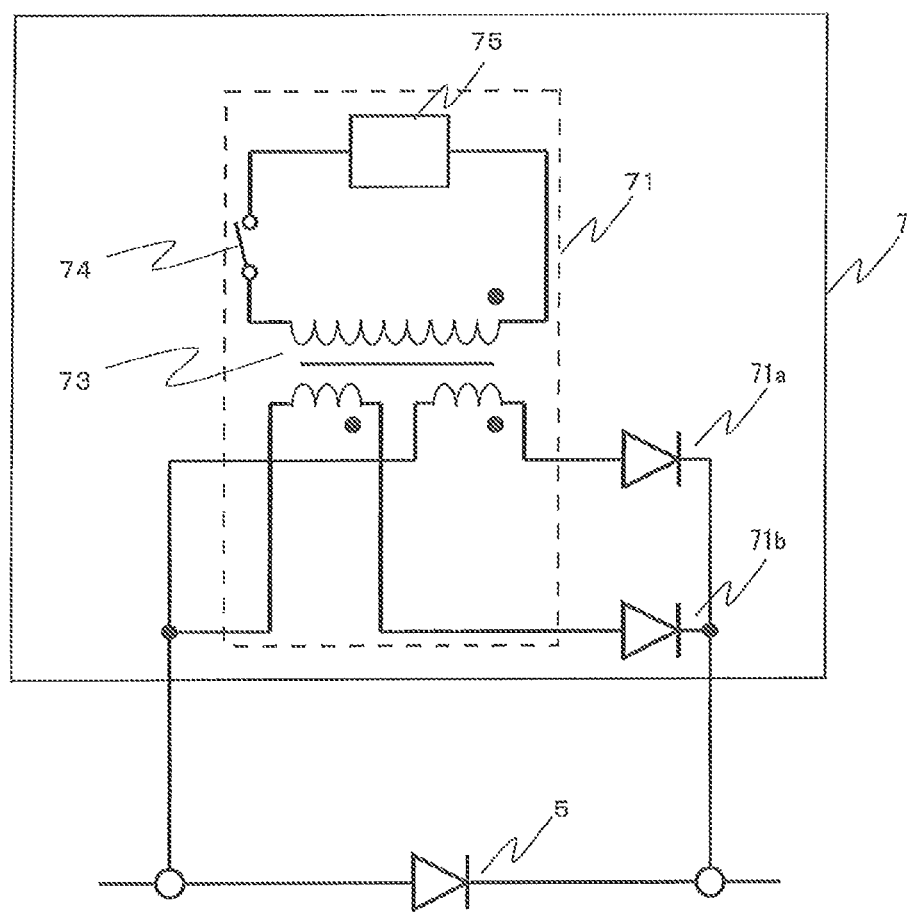
FIG. 11 illustrates an example (1) in which the commutating device 7 is connected in parallel with the backflow preventing element 5, in accordance with Embodiment 4 of the present invention.
Figure 12:
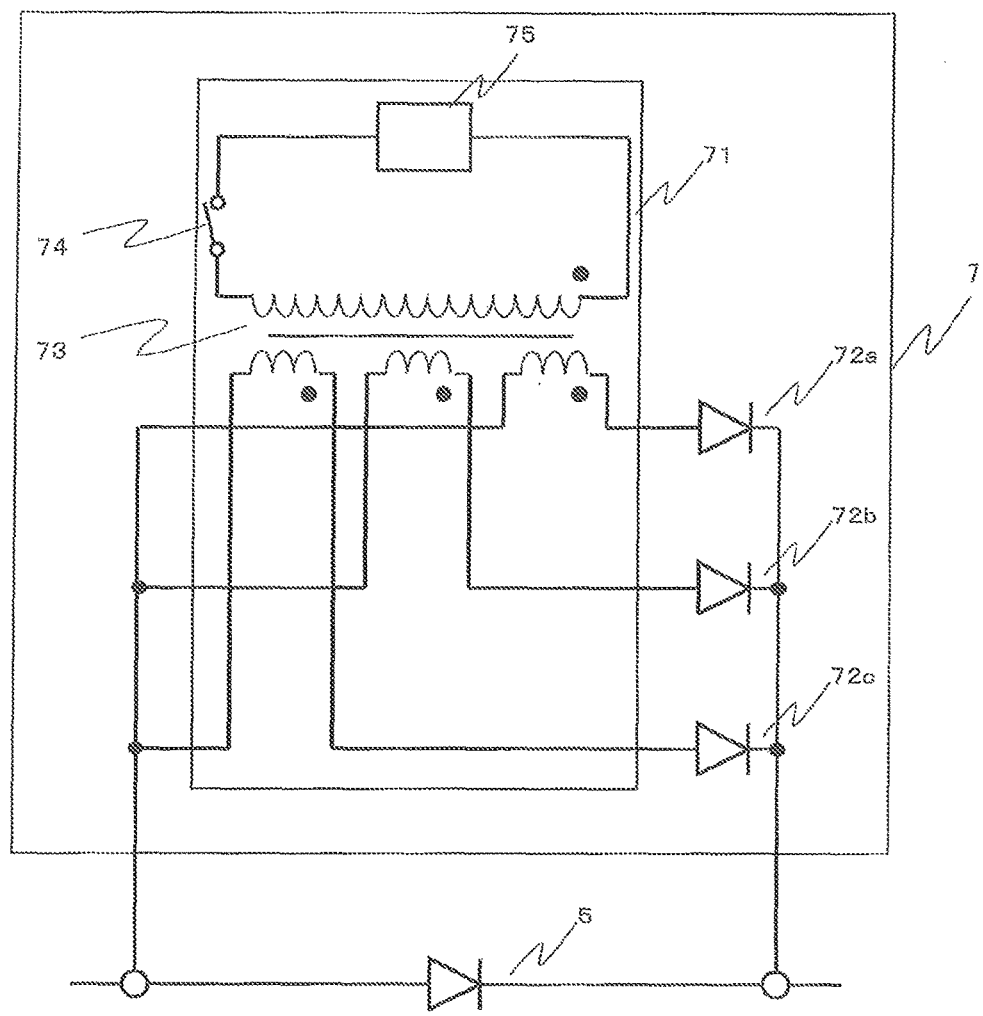
FIG. 12 illustrates an example (2) in which the commutating device 7 is connected in parallel with the backflow preventing element 5, in accordance with Embodiment 4 of the present invention.

FIG. 11 and FIG. 12 illustrate examples in which the commutating device 7 is connected in parallel with the backflow preventing element 5, in accordance with Embodiment 4 of the present invention. For example, the configuration of the system is similar to that described with reference to FIG. 1 in Embodiment 1. In Embodiment 4, the configuration of the commutating device 7 is different from those in FIG. 2 and FIG. 3 in that a primary winding of a transformer 73, a commutation switch 74, and a commutation power supply 75 are shared between or among a plurality of commutation paths. Therefore, in Embodiment 4, there is one commutation switch 74 in the commutating device 7.

Figure 13:
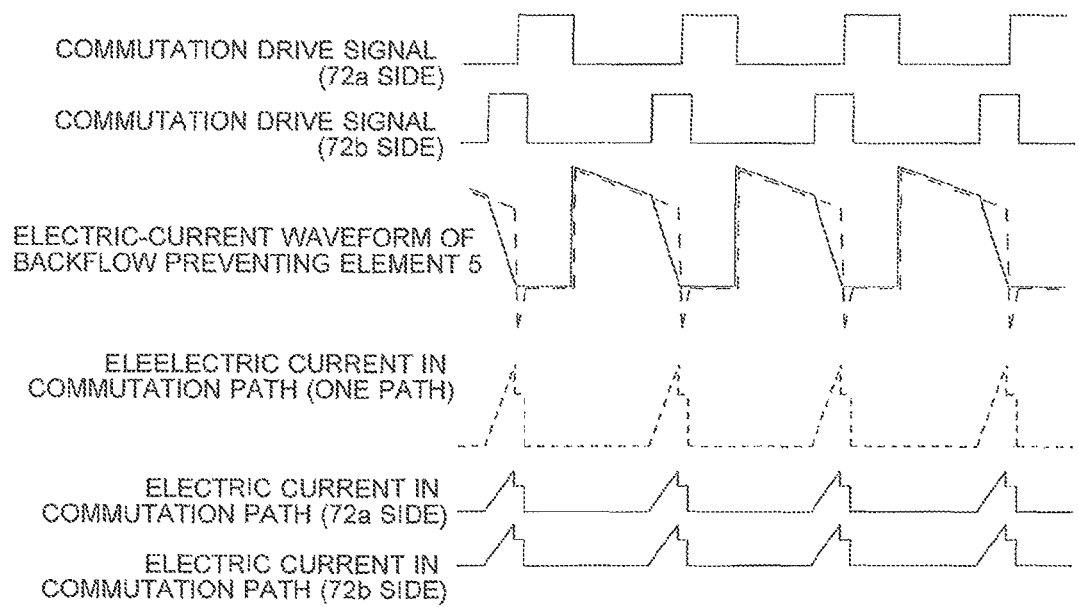
FIG. 13 is a diagram (1) illustrating signal and electric current waveforms in a case where the commutating device 7 according to Embodiment 4 of the present invention is operated.
Figure 14:
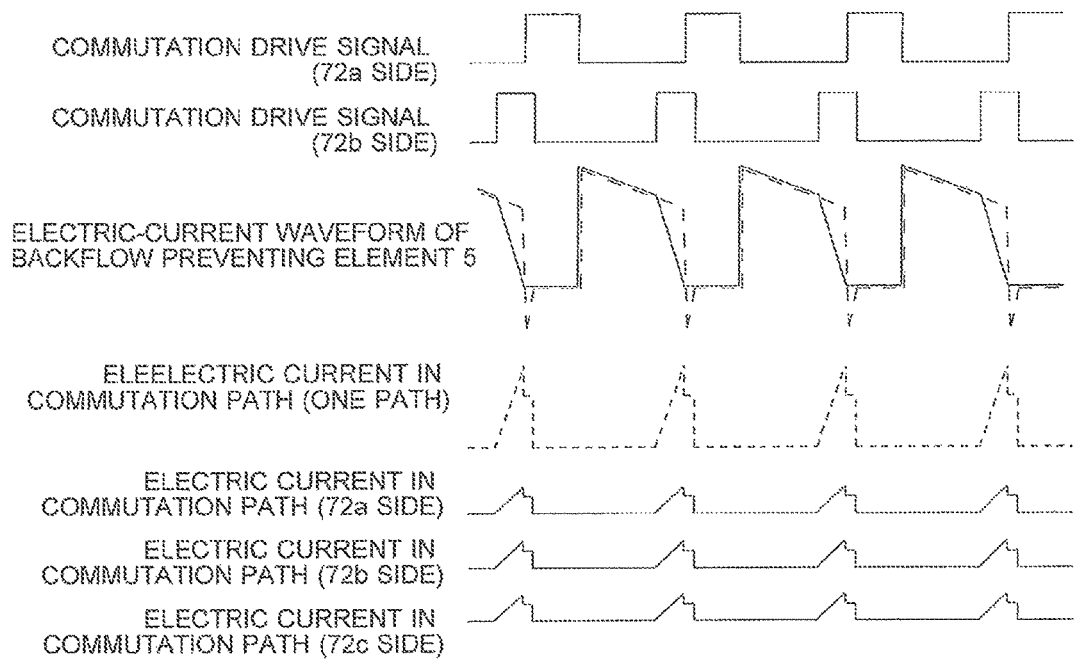
FIG. 14 is a diagram (2) illustrating signal and electric current waveforms in a case where the commutating device 7 according to Embodiment 4 of the present invention is operated.

FIG. 13 and FIG. 14 are diagrams illustrating signal and electric current waveforms in a case where the commutating device 7 according to Embodiment 4 of the present invention is operated. In Embodiment 4, since there is one commutation switch 74, the controller 100 only has to send one commutation drive signal. Moreover, since the timing at which voltage is induced to the secondary windings of the transformer 73 is the same, the electric current flowing toward the commutating device 7 in accordance with a commutation operation flows distributively to the commutation paths, as in the case of Embodiment 1, so that a peak value and an average value of the electric current flowing to each commutation path decrease in accordance with the number of commutation paths, as compared with a case where a commutation rectifying element 72 is provided in a single commutation path.

Furthermore, electric current flowing backward from the load 9 side toward the power supply 1 side is also reduced. Therefore, the current-carrying capacity of each commutation rectifying element 72 can be reduced. By reducing the current-carrying capacity, many types of elements can be employed as the commutation rectifying elements 72. Moreover, cost reduction can be achieved. In addition, with the plurality of commutation paths provided, even if, for example, the electric current cannot flow toward a certain commutation path due to a failure of at least one of the commutation rectifying element 72 and the commutation operation circuit 71 in the commutation path, the electric current can still flow through another commutation path, thereby allowing for enhanced reliability for reducing recovery electric current.

Accordingly, in the commutating device 7 according to Embodiment 4, the primary winding of the transformer 73, the commutation switch 74, and the commutation power supply 75 are shared between or among the plurality of commutation paths, so that, for example, cost reduction and size reduction of the apparatus can be achieved as a result of the reduced number of elements.

Embodiment 5

Figure 15:
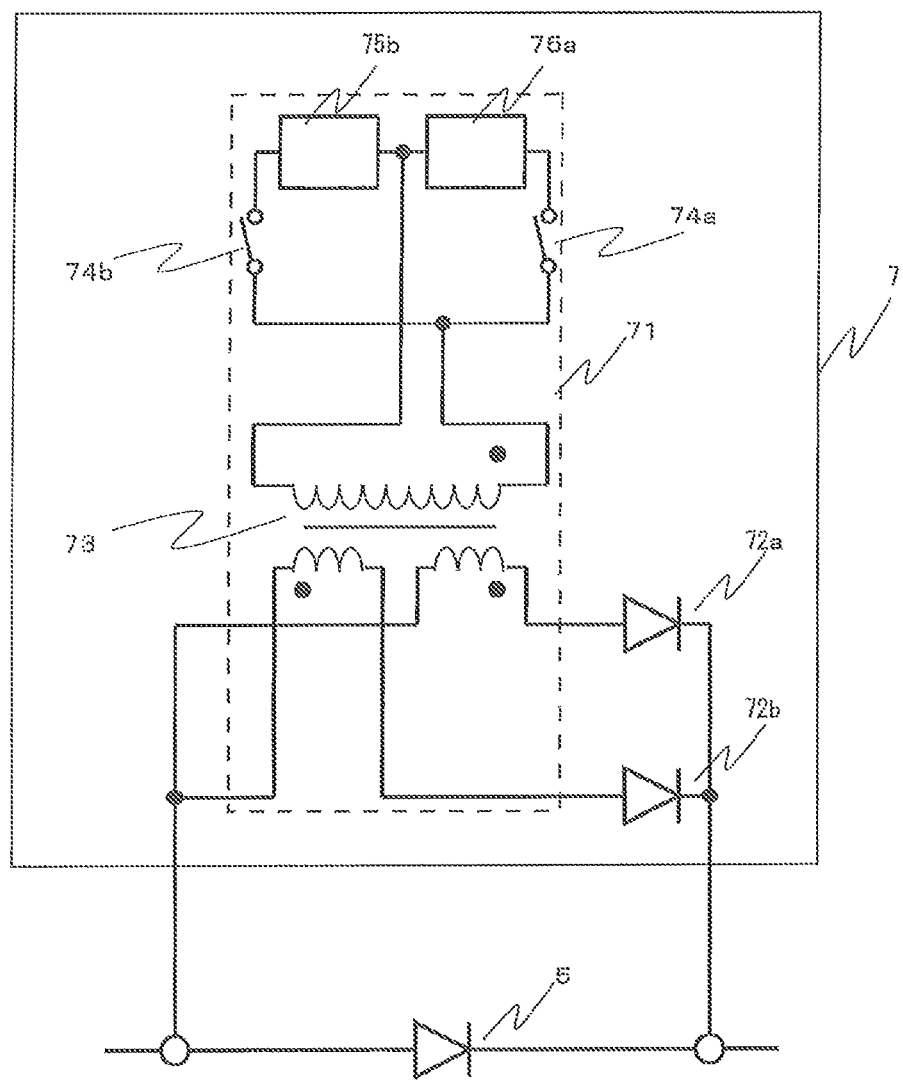
FIG. 15 illustrates an example (1) in which the commutating device 7 is connected in parallel with the backflow preventing element 5, in accordance with Embodiment 5 of the present invention.
Figure 16:
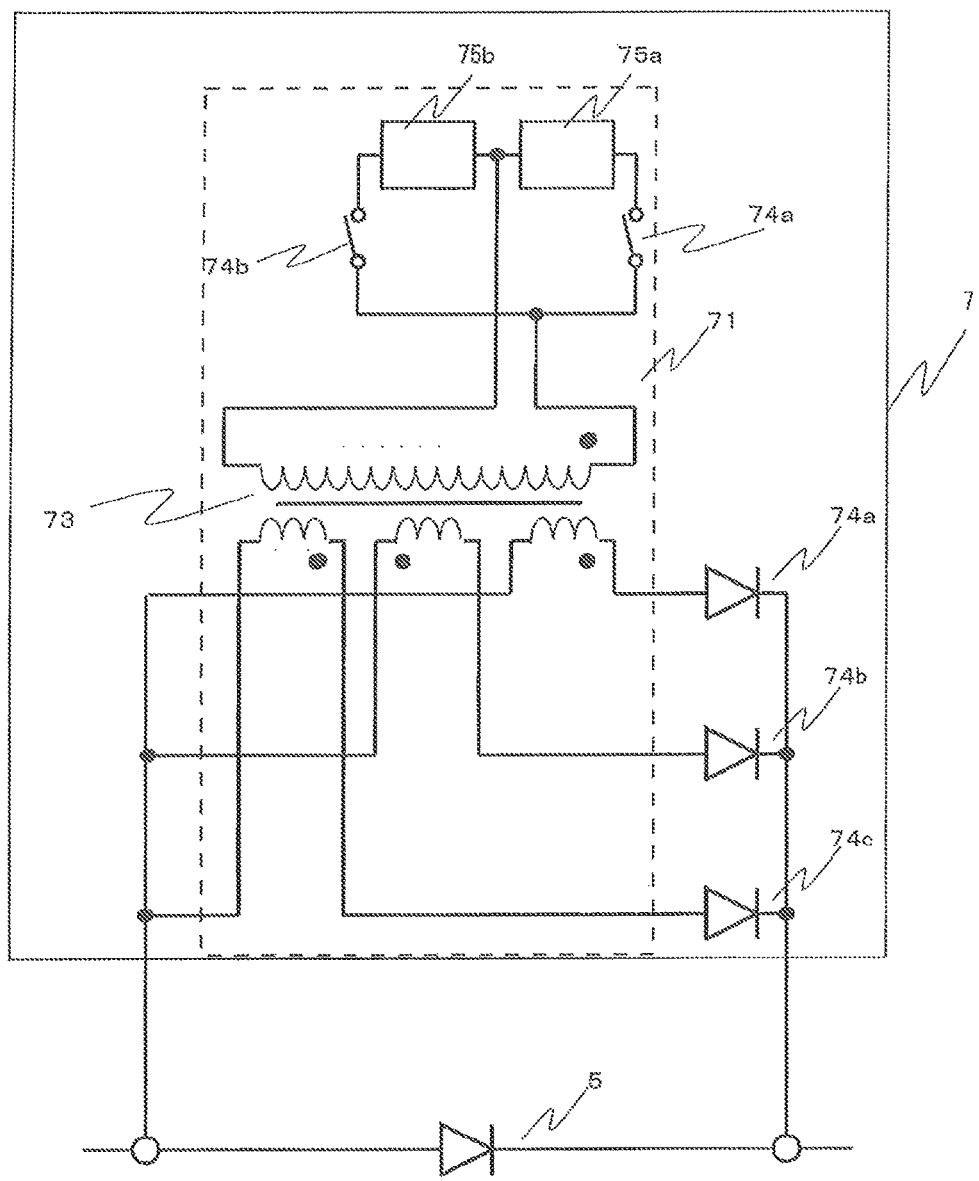
FIG. 16 illustrates an example (2) in which the commutating device 7 is connected in parallel with the backflow preventing element 5, in accordance with Embodiment 5 of the present invention.

FIG. 15 and FIG. 16 illustrate examples in which the commutating device 7 is connected in parallel with the backflow preventing element 5, in accordance with Embodiment 5 of the present invention. For example, the configuration of the system is similar to that described with reference to FIG. 1 in Embodiment 1. In Embodiment 5, the configuration of the commutating device 7 is different from those in FIG. 10 and FIG. 11. Embodiment 5 is similar to Embodiment 2 in that the primary winding of the transformer 73, the commutation switch 74, and the commutation power supply 75 are shared between or among the plurality of commutation paths. However, in Embodiment 5, two commutation switches 74 (74a and 74b) and two commutation power supplies 75 (75a and 75b) are provided.

Figure 17:
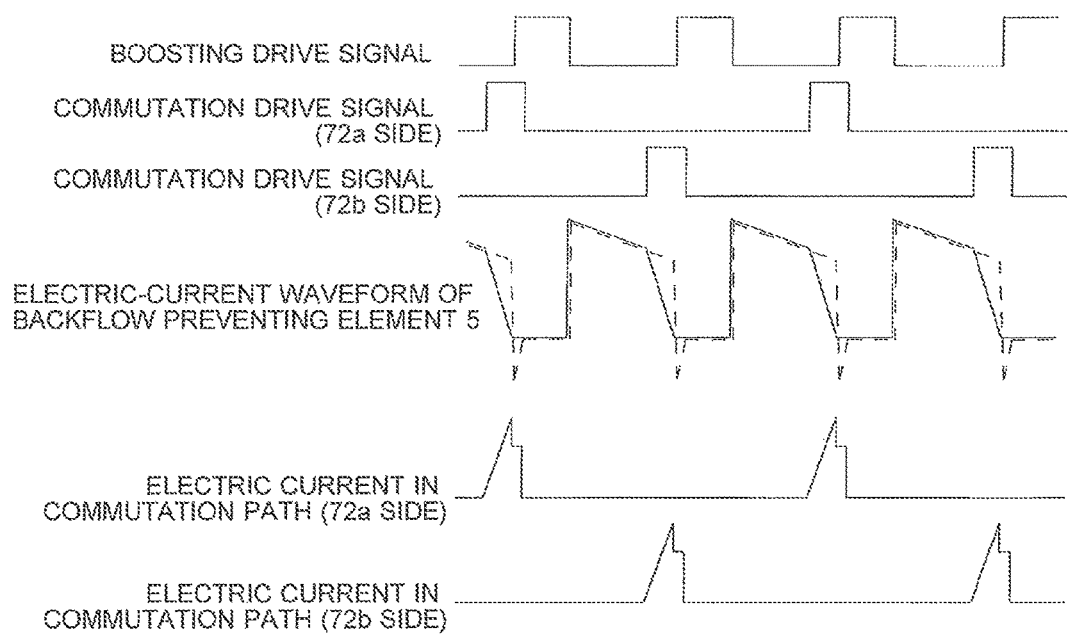
FIG. 17 is a diagram (1) illustrating signal and electric current waveforms in a case where the commutating device 7 according to Embodiment 5 of the present invention is operated.
Figure 18:
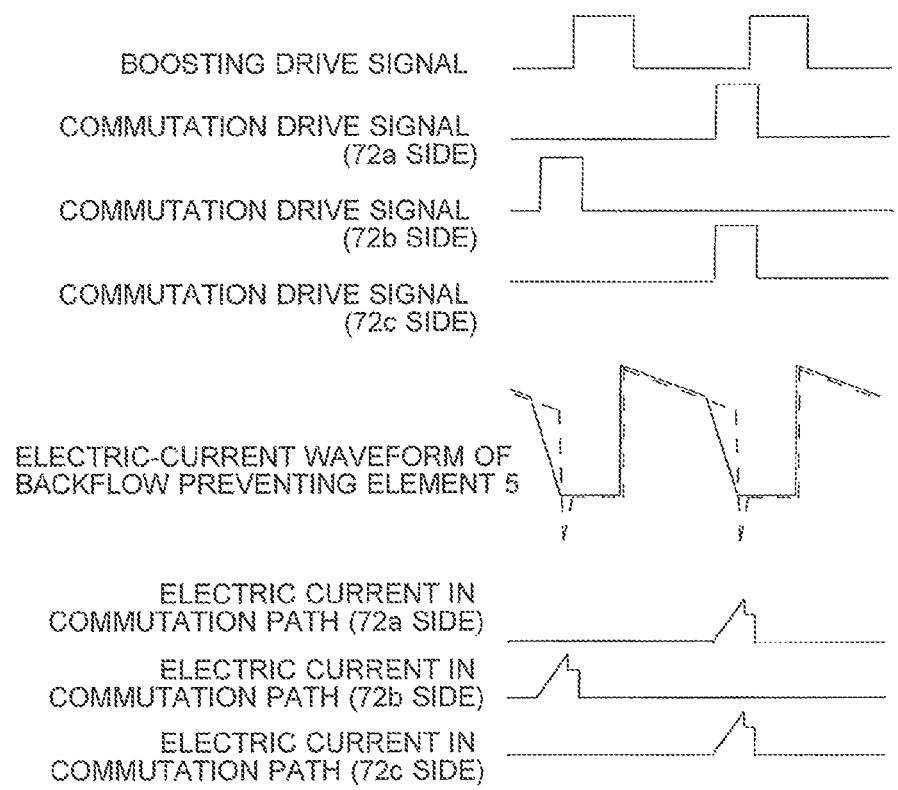
FIG. 18 is a diagram (2) illustrating signal and electric current waveforms in a case where the commutating device 7 according to Embodiment 5 of the present invention is operated.

FIG. 17 and FIG. 18 are diagrams illustrating signal and electric current waveforms in a case where the commutating device 7 according to Embodiment 5 of the present invention is operated. The direction in which voltage is applied to the primary winding of the transformer 73 (i.e., the direction of electric current flowing to the primary winding) is different between when the commutation switch 74a is turned on and when the commutation switch 74b is turned on. The controller 100 sends commutation drive signals for alternately turning on the commutation switch 74a and the commutation switch 74b.

The secondary windings of the transformer 73 in the respective commutation paths include a type with the same polarity as the primary winding and a type (i.e., a reversely-wound type) with a polarity different from that of the primary winding. In FIG. 17, the secondary windings in two commutation paths have polarities different from each other. Therefore, with regard to the commutation operation in the commutating device 7, the commutation operation is performed alternately between the respective commutation paths, as in Embodiment 2. Furthermore, in FIG. 17, the primary winding in the commutation path having the commutation rectifying element 72a and in the commutation path having the commutation rectifying element 72c has the same polarity as the secondary windings. The primary winding in the commutation path having the commutation rectifying element 72b has a polarity different from that of the secondary winding. Therefore, with regard to the commutation operation in the commutating device 7, the commutation operation is performed alternately between the two commutation paths and the one commutation path.

Figure 19:
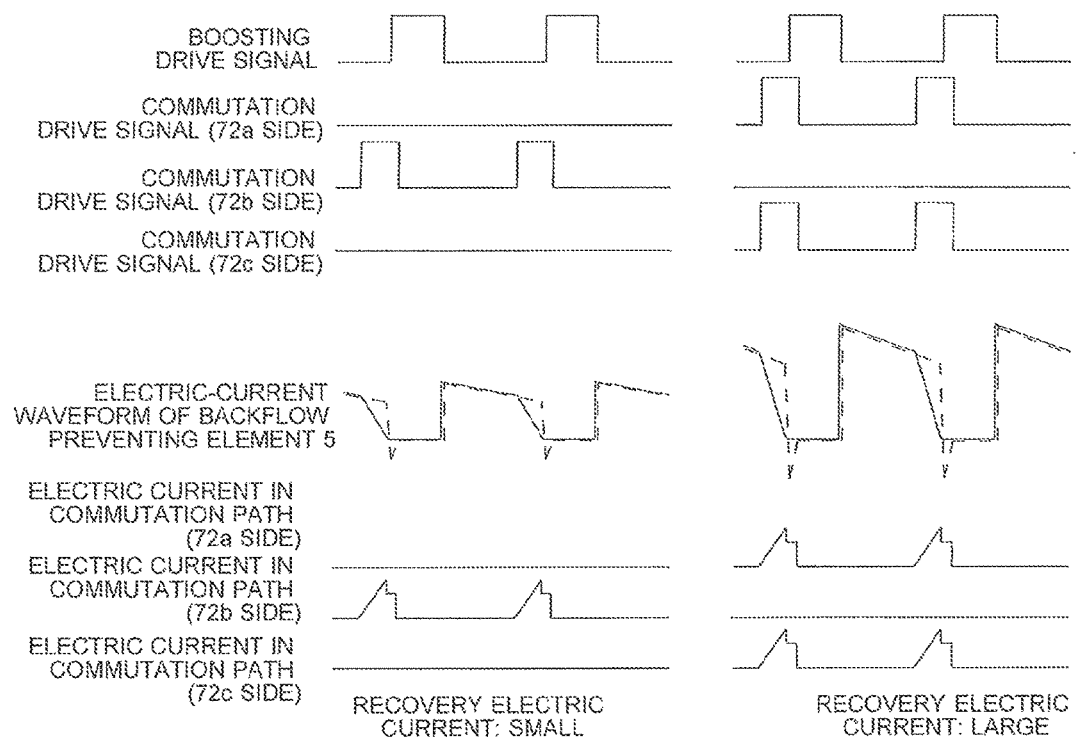
FIG. 19 is a diagram for explaining the relationship between a commutation operation and electric current flowing through the backflow preventing element 5 according to Embodiment 5 of the present invention.

FIG. 19 is a diagram for explaining the relationship between a commutation operation and electric current flowing through the backflow preventing element 5 according to Embodiment 5 of the present invention. In Embodiment 3 described above, the controller 100 sets the number of commutation paths to which electric current is made to flow based on the magnitude of recovery electric current.

For example, in the commutating device 7 shown in FIG. 16, the number of commutation paths to which electric current flows varies (i.e., from among the commutation path having the commutation rectifying element 72b, the commutation path having the commutation rectifying element 72a, and the commutation path having the commutation rectifying element 72c) depending on the direction in which electric current flows through the primary winding of the transformer 73. The controller 100 determines, for example, the magnitude of recovery electric current. If it is determined that the recovery electric current is small, a commutation drive signal for opening and closing the commutation switch 74a is sent so that the electric current is made to flow through the commutation path having the commutation rectifying element 72a. If it is determined that the recovery electric current is large, a commutation drive signal for opening and closing the commutation switch 74b is sent so that the electric current is made to flow through the commutation paths having the commutation rectifying elements 72a and 72c.

Accordingly, in the commutating device 7 according to Embodiment 5, the primary winding of the transformer 73, the commutation switch 74, and the commutation power supply 75 are shared between or among the plurality of commutation paths, so that, for example, cost reduction and size reduction of the apparatus can be achieved as a result of the reduced number of elements. Moreover, the commutation operation is performed at different timings with respect to the plurality of commutation paths.

Embodiment 6

Figure 20:
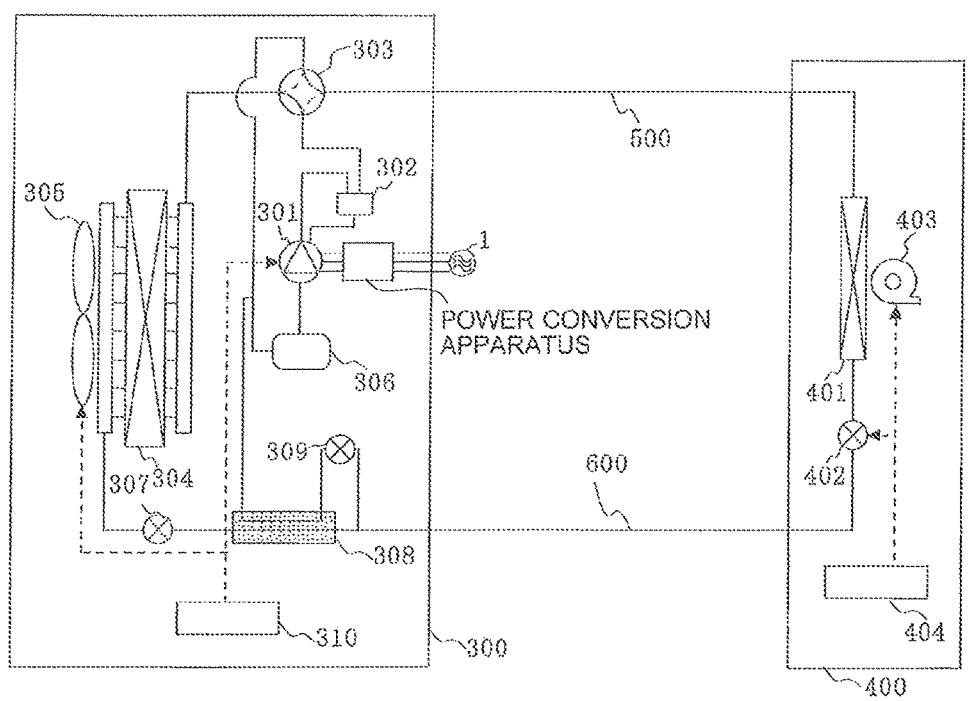
FIG. 20 illustrates the configuration of a refrigerating and air-conditioning apparatus according to Embodiment 6 of the present invention.

FIG. 20 illustrates the configuration of a refrigerating and air-conditioning apparatus according to Embodiment 6 of the present invention. The following description of Embodiment 6 relates to a refrigerating and air-conditioning apparatus in which electric power is supplied via the above-described power conversion apparatus. The refrigerating and air-conditioning apparatus in FIG. 20 includes a heat-source-side unit (i.e., an outdoor unit) 300 and a load-side unit (i.e., an indoor unit) 400, which are connected by refrigerant pipes to constitute a main refrigerant circuit (referred to as "main refrigerant circuit" hereinafter) through which refrigerant circulates. The refrigerant pipes include a gas pipe 500 through which gaseous refrigerant (i.e., gas refrigerant) flows and a liquid pipe 600 through which liquid refrigerant (i.e., liquid refrigerant but may sometimes be two-phase gas-liquid refrigerant) flows.

In Embodiment 6, the heat-source-side unit 300 is constituted of various units (means), which include a compressor 301, an oil separator 302, a four-way valve 303, a heat-source-side heat exchanger 304, a heat-source-side fan 305, an accumulator 306, a heat-source-side expansion unit (i.e., an expansion valve) 307, a heat exchanger 308 related to refrigerant, a bypass expansion unit 309, and a heat-source-side controller 310.

The compressor 301 compresses and discharges suctioned refrigerant. The compressor 301 has an inverter that can finely adjust the capacity (i.e., the amount of refrigerant to be discharged per unit time) of the compressor 301 by arbitrarily changing the operating frequency. The power conversion apparatus described in any one of Embodiment 1 to Embodiment 5 described above is attached between, for example, the power supply 1, which supplies electric power for driving the compressor 301 (i.e., a motor), and the compressor 301 having the inverter serving as the load 9. A device constituted of a combination of the power conversion apparatus and the inverter serves as a motor driver.

The oil separator 302 separates lubricating oil mixed in the refrigerant and discharged from the compressor 301. The separated lubricating oil is returned to the compressor 301. The four-way valve 303 changes the flow of the refrigerant in accordance with a cooling operation mode and a heating operation mode based on a command from the heat-source-side controller 310. The heat-source-side heat exchanger 304 exchanges heat between the refrigerant and air (i.e., outdoor air). During heating operation, the heat-source-side heat exchanger 304 functions as an evaporator and exchanges heat between the air and low-pressure refrigerant flowing in via the heat-source-side expansion unit 307, thereby evaporating and gasifying the refrigerant. During cooling operation, the heat-source-side heat exchanger 304 functions as a condenser and exchanges heat between the air and the refrigerant flowing in from the four-way valve 303 side and compressed by the compressor 301, thereby condensing and liquefying the refrigerant. In order to efficiently exchange heat between the refrigerant and the air, the heat-source-side heat exchanger 304 is provided with the heat-source-side fan 305. With regard to the heat-source-side fan 305, the rotation speed of the fan may be finely adjusted by supplying electric power thereto via the power conversion apparatus according to any one of Embodiment 1 to Embodiment 5 described above and, for example, arbitrarily changing the operating frequency of the fan motor in the inverter included in the load 9.

The heat exchanger 308 related to refrigerant exchanges heat between refrigerant flowing through a main flow path of the refrigerant circuit and refrigerant that has diverged from that flow path and whose flow rate has been adjusted by the bypass expansion unit 309 (i.e., an expansion valve). In particular, when the refrigerant needs to be subcooled during cooling operation, the refrigerant heat exchanger 308 subcools the refrigerant and supplies the refrigerant to the load-side unit 400. The liquid flowing via the bypass expansion unit 309 is returned to the accumulator 306 via a bypass pipe. The accumulator 306 is, for example, means for storing excess liquid refrigerant. The heat-source-side controller 310 is formed of, for example, a microcomputer. The heat-source-side controller 310 is capable of communicating with a load-side controller 404 in a wired or wireless manner. For example, based on data related to detection by various types of detecting means (i.e., sensors) within the refrigerating and air-conditioning apparatus, the heat-source-side controller 310 controls the overall operation of the refrigerating and air-conditioning apparatus by controlling each means related to the refrigerating and air-conditioning apparatus, such as by controlling the operating frequency of the compressor 301 by controlling an inverter circuit. Furthermore, the processing performed by the controller 100 described in each of Embodiment 1 to Embodiment 5 may be performed by the heat-source-side controller 310.

The load-side unit 400 is constituted of a load-side heat exchanger 401, a load-side expansion unit (i.e., an expansion valve) 402, a load-side fan 403, and the load-side controller 404. The load-side heat exchanger 401 exchanges heat between refrigerant and air. For example, during heating operation, the load-side heat exchanger 401 functions as a condenser and exchanges heat between the air and refrigerant flowing in from the gas pipe 500 to condense and liquefy the refrigerant (or to change the refrigerant into a two-phase gas-liquid state), and discharges the refrigerant toward the liquid pipe 600. During cooling operation, the load-side heat exchanger 401 functions as an evaporator and exchanges heat between the air and refrigerant changed into a low-pressure state by the load-side expansion unit 402 to evaporate and gasify the refrigerant by making the refrigerant receive heat from the air, and discharges the refrigerant toward the gas pipe 500. Furthermore, the load-side unit 400 is provided with the load-side fan 403 for adjusting the flow of air that is to exchange heat with the refrigerant. The operating speed of the load-side fan 403 is set by, for example, a user. The load-side expansion unit 402 is provided for adjusting the pressure of the refrigerant within the load-side heat exchanger 401 by changing the opening degree of the load-side expansion unit 402.

The load-side controller 404 is also formed of, for example, a microcomputer and is capable of communicating with, for example, the heat-source-side controller 310 in a wired or wireless manner. Based on a command from the heat-source-side controller 310 or a command from, for example, a resident, each unit (i.e., means) in the load-side unit 400 is controlled such that, for example, the indoor temperature is set to a predetermined temperature. Furthermore, a signal that contains data related to detection by detecting means provided in the load-side unit 400 is transmitted.

Accordingly, in the refrigerating and air-conditioning apparatus according to Embodiment 8, electric power is supplied to, for example, the compressor 301 and the heat-source-side fan 305 by using the power conversion apparatus according to any one of Embodiment 1 to Embodiment 5 described above, whereby a highly-efficient, highly-reliable refrigerating and air-conditioning apparatus can be obtained.

INDUSTRIAL APPLICABILITY

Although Embodiment 8 described above is directed to a case where the power conversion apparatus according to the present invention is applied to the refrigerating and air-conditioning apparatus, the present invention is not limited to the above. The power conversion apparatus according to the present invention may also be applied to, for example, a heat pump apparatus, an apparatus that utilizes a refrigeration cycle (i.e., a heat pump cycle), such as a refrigerator, a transport apparatus, such as an elevator, an illuminator (system), a hybrid vehicle, or a photovoltaic power conditioner. In that case, similar advantages can be exhibited.

REFERENCE SIGNS LIST

1 power supply 3 reactor 4 boosting switch device 5 backflow preventing element 6 chopper circuit 7 commutating device 8 smoothing device 9 load 70 commutation operation unit 71, 71a, 71b, 71c commutation operation circuit 72, 72a, 72b, 72c commutation rectifying element 73 transformer 74, 74a, 74b commutation switch 75, 75a, 75b commutation power supply 100 controller 101 load voltage detector 102 electric current detector 103 power-supply voltage detector 300 heat-source-side unit 301 compressor 302 oil separator 303 four-way valve 304 heat-source-side heat exchanger 305 heat-source-side fan 306 accumulator 307 heat-source-side expansion unit 308 heat exchanger related to refrigerant 309 bypass expansion unit 310 heat-source-side controller 400 load-side unit 401 load-side heat exchanger 402 load-side expansion unit 403 load-side fan 404 load-side controller 500 gas pipe 600 liquid pipe

The invention claimed is:

1. A backflow preventing device comprising:
   a backflow preventing element connected between a power supply and a load and configured to prevent backflow of electric current from a side of the load toward a side of the power supply;
   a commutating device configured to perform a commutation operation for causing the electric current to flow to a commutation path connected to serve as a different path in parallel with the backflow preventing element; and
   a controller configured to cause the commutating device to perform the commutation operation,
   wherein the backflow preventing device has a plurality of the commutation paths.

2. The backflow preventing device of claim 1,
   wherein the controller is configured to cause the commutating device to start the commutation operation to the plurality of commutation paths at a substantially same timing.

3. The backflow preventing device of claim 1,
   wherein the controller is configured to cause the commutating device to start the commutation operation to the plurality of commutation paths at different timings.

4. The backflow preventing device of claim 1,
   wherein the controller is configured to cause the commutating device to end the commutation operation to the plurality of commutation paths at a substantially same timing.

5. The backflow preventing device of claim 1,
   wherein the controller is configured to set a number of commutation paths to which the electric current is made to flow, in the commutation operation.

6. The backflow preventing device of claim 5, further comprising:
   an electric current detector configured to detect the electric current flowing from the side of the load toward the side of the power supply,
   wherein the controller is configured to set the number of commutation paths based on a magnitude of the electric current detected by the electric current detector.

7. The backflow preventing device of claim 1,
   wherein the commutating device has a commutation rectifying element configured to rectify the electric current flowing through each commutation path,
   a transformer configured to apply, to a secondary winding in each commutation path, a voltage based on a voltage related to a primary winding and to perform the commutation operation, and
   a transformer driver having a commutation power supply and a commutation switch and connected to the primary winding of the transformer, the transformer driver opening and closing the commutation switch to control excitation current flowing toward the primary winding of the transformer from the commutation power supply.

8. The backflow preventing device of claim 7,
   wherein at least the commutation switch, the transformer, and the commutation rectifying element are provided equal in number to the number of the commutation paths.

9. The backflow preventing device of claim 7,
   wherein at least the commutation switch, the secondary winding of the transformer, and the commutation rectifying element are provided equal in number to the number of the commutation paths, and
   wherein the primary winding of the transformer is shared.

10. The backflow preventing device of claim 7,
    wherein at least one secondary winding has a polarity different from a polarity of the primary winding, and
    wherein the commutation operation is performed at different timings with respect to the plurality of commutation paths by changing a direction of the electric current flowing to the primary winding.

11. The backflow preventing device of claim 7,
    wherein the commutation rectifying element is an element employing a wide-band gap semiconductor.

12. The backflow preventing device of claim 11,
    wherein the wide-band gap semiconductor is composed of silicon carbide, a gallium-nitride-based material, or diamond.

13. A power conversion apparatus comprising:
    a smoothing device configured to smooth an output voltage;
    a switch device disposed at a side of a power supply relative to the smoothing device and configured to short-circuit the power supply by opening and closing a switch;
    a reactor disposed at the side of the power supply relative to the switch device;
    the backflow preventing device of claim 1 configured to prevent backflow of electric current from a side of a load; and
    a controller configured to control a commutation operation of the backflow preventing device and to control opening and closing of the switch of the switch device.

14. The power conversion apparatus of claim 13, further comprising:
    an electric current detector configured to detect at least one of an electric current flowing from the power supply, an electric current flowing through the reactor, an electric current flowing through the switch device, an electric current flowing through the backflow preventing element, and an electric current flowing to the load,
    wherein the controller is configured to determine a magnitude of the electric current flowing from the side of the load toward the side of the power supply based on the electric current detected by the electric current detector.

15. The power conversion apparatus of claim 13, further comprising:
   a voltage detector configured to detect at least one of a voltage related to the backflow preventing element and a voltage applied to the load,
   wherein the controller is configured to determine a magnitude of the electric current flowing from the side of the load toward the side of the power supply based on the voltage detected by the voltage detector.

16. The power conversion apparatus of claim 13, further comprising:
   a power detector configured to detect at least one of electric power supplied from the power supply and electric power supplied to the load,
   wherein the controller is configured to determine a magnitude of the electric current flowing from the side of the load toward the side of the power supply based on the electric power detected by the power detector.

17. A motor driver comprising:
   the power conversion apparatus of claim 13; and
   an inverter configured to convert electric power supplied by the power conversion apparatus into alternating-current power.

18. A refrigerating and air-conditioning apparatus comprising:
   the motor driver of claim 17 for driving at least one of a compressor and a blower.

* * * * *